(12) United States Patent
Kamimura et al.

(10) Patent No.: US 7,403,228 B2
(45) Date of Patent: Jul. 22, 2008

(54) SOLID-STATE CAMERA DEVICE AND METHOD OF MANUFACTURING THE SAME, AND METHOD OF MAKING MASK FOR MANUFACTURING THE DEVICE

(75) Inventors: Shinya Kamimura, Kitakatsuragi-gun (JP); Masashi Inoue, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 695 days.

(21) Appl. No.: 10/945,871

(22) Filed: Sep. 22, 2004

(65) Prior Publication Data

US 2005/0035377 A1    Feb. 17, 2005

Related U.S. Application Data

(62) Division of application No. 09/580,498, filed on May 30, 2000, now abandoned.

(30) Foreign Application Priority Data

Jun. 2, 1999    (JP) .............................. 1999/154954

(51) Int. Cl.
  *H04N 5/225* (2006.01)
  *H04N 5/335* (2006.01)
(52) U.S. Cl. ...................................... 348/340; 348/280
(58) Field of Classification Search .................. 348/340, 348/280; 257/98; 250/216, 208.1
  See application file for complete search history.

(56) References Cited

U.S. PATENT DOCUMENTS 5,439,621 A * 8/1995 Hoopman .................. 264/2.5
5,682,203 A * 10/1997 Kato .......................... 348/340
5,871,653 A * 2/1999 Ling ............................. 216/2

(Continued)

FOREIGN PATENT DOCUMENTS

JP    6-37289 A    2/1994

(Continued)

OTHER PUBLICATIONS

U.S. Appl. No. 09/580,498, filed May 30, 2000.

(Continued)

*Primary Examiner*—James M. Hannett
(74) *Attorney, Agent, or Firm*—Nixon & Vanderhye P.C.

(57) ABSTRACT

The present invention provides a solid-state camera device which can improve both the shading caused by the eclipse of the incident light and the shading cased by the rim darkening. The present solid-state camera device comprises a plurality of light-receiving parts 1 arranged at a constant interval on a substrate, and a plurality of light-focusing parts 2 disposed corresponding to each of the light-receiving parts on the substrate surface so that the incident light is focused on the light-receiving parts. Further, the position of each of the light-focusing parts is shifted gradually larger toward the center of the camera region O based on the corresponding light-receiving parts and the size along the substrate surface of each of the light-focusing parts 2, $W_1', \ldots, W_{n-1}', W_n'$, becomes gradually larger, as the location of the light-focusing parts is getting closer to the peripheral camera region 22 from the middle of the camera region 21 in front of the exit pupil on the substrate in the direction along the substrate surface.

3 Claims, 8 Drawing Sheets

U.S. PATENT DOCUMENTS 6,008,511 A * 12/1999 Tokumitsu et al. .......... 257/232
6,178,035 B1 * 1/2001 Eda et al. .................... 359/326
6,476,851 B1 * 11/2002 Nakamura ................... 348/65

FOREIGN PATENT DOCUMENTS

| JP | 61-140609 | 5/1994 |
| JP | 9-260624 | 10/1997 |
| JP | 11-186530 A | 7/1999 |

OTHER PUBLICATIONS

Japanese Office Action mailed Feb. 12, 2003 in corresponding Japanese application No. 11-154954.

* cited by examiner

Output signal wave according to
The Present invention $P' = a \times P$
$(a < 1)$

SOLID-STATE CAMERA DEVICE AND METHOD OF MANUFACTURING THE SAME, AND METHOD OF MAKING MASK FOR MANUFACTURING THE DEVICE

This application is a Divisional of application Ser. No. 09/580,498 filed May 30, 2000 now abandoned, the entire content of which is hereby incorporated herein by reference in this application.

FIELD OF THE INVENTION

The present invention relates to a solid-state camera device which can correct shading, and to a method of manufacturing the same. The present invention also relates to a method of manufacturing a mask for forming light-receiving parts of such a solid-state camera device.

BACKGROUND OF THE INVENTION

Recently, solid-state camera devices are built in many video cameras and electronic still cameras in order to reduce size and weight of such cameras. As shown in FIG. 6, a solid-state camera device, generally, comprises a plurality of sets of a light-receiving part 1 and a vertical transfer part 6 which are arranged along by each other on a semi-conductor substrate 7, a plurality of vertical transfer electrodes 5 which are formed on each of the vertical transfer parts 6, a shading film 4 which covers the vertical transfer parts 6 and opens on the light-receiving parts 1, and a plurality of color filters 3 which are arranged above each of the light-receiving parts 1 and, further comprises, in order to focus the incident light effectively on the light-receiving parts, a plurality of generally hemispherical microlenses 2 as a light-focusing part formed above each of the color filters 3 at positions corresponding to the light-receiving parts 1. A process of forming the microlenses 2 is as follows. First, a transparent film of a composition for the microlens having photo-sensitivity and thermoplasticity is formed by applying the composition on the substrate 7 on which the shading film 4 and the color filter 3 have been arranged. Next, the film is patterned by exposure with a specified mask and development. Then, the patterned film is softened by heat treatment to make the patterns generally hemispherical.

As shown in FIG. 7(a), in the case where an eye point distance (distance between the shading film 4 and an aperture stop 9 defining an exit pupil 9a) L in an optical system of a camera is relatively long (L=$L_1$), an incident light IL, which has passed through the microlens 2, can enter into an opening 4a of the shading film 4 (i.e., the light-receiving part 1) not only in the middle of the camera region 21 (a region in the front of the exit pupil) but region in the peripheral camera region 22 (a region remote from the middle of the camera region along the substrate surface).

On the other hand, in the case where an eye point distance L is relatively short (L=$L_2$) as shown in FIG. 7(b), in the peripheral camera region 22, particularly in the peripheral region in the lateral direction, an incident angle of IL to the microlens becomes larger compared to the case where an eye point distance is long (L=$L_1$), and a part of IL is prevented from entering into the opening 4a (i.e., so-called "eclipse" of the incident light IL occurs), consequently, a proportion of a light quantity that enters into the light-receiving part 1 decreases. Thus, sensitivity of the camera device becomes lower in the peripheral camera region 22 than in the middle of the camera region 21, resulting in a phenomenon that brightness diminishes in the peripheral region of its screen (so-called deterioration of "shading"). A broken line in FIG. 8 shows an output voltage wave in one laterally scanning period 1H of a camera, indicating that the intensity of the output signal in the peripheral camera region $V_e$ is significantly lower than the signal intensity in the middle of the camera region $V_0$.

As a method of preventing the deterioration of the shading, JP-A 140609/1994 describes a technique of performing slight-scaling with referring to the center of a camera region as shown in FIG. 9. The "slight-scaling" is a technique of shifting each of the microlenses 2 gradually larger toward the center of the camera region based on the corresponding light-receiving parts 1, as the location of the microlens is getting closer to the peripheral camera region 22 from the middle of the camera region 21 by using an interval P' for a microlens array (consisting of microlenses 2 having a common size) which is smaller than an interval P for the light-receiving parts 1, i.e., opening 4a (P'=a×P; scale a is <1, e.g., "a" is set to be 0.9999). Thus, the eclipse of the incident light IL in the peripheral camera region 22 is reduced. A dotted line in FIG. 8 indicates that the slight-scaling technique decreased the difference between $V_e$ and $V_0$, that is, the shading was somewhat corrected in comparison with the case where the slight-scaling was not performed (the broken line).

Further, in an optical system of a camera, especially when its aperture stop opens fully, a phenomenon occurs that a quantity of the light having passed through near the rim of its lens is less than that of the light having passed through the middle of the lens (so-called "rim darkening"). The slight-scaling technique can not sufficiently correct the shading caused by the rim darkening.

Therefore, an object of the present invention is to provide a solid-state camera device which can correct the shading caused by the eclipse of the incident light and, further can correct the shading caused by the rim darkening, and to provide a method of manufacturing it. Another object of the present invention is to provide a method of manufacturing a mask for forming light-focusing parts of such a solid-state camera device.

These objects as well as other objects and advantages of the present invention will become apparent to those skilled in the art by the following description with reference to the attached drawings.

SUMMARY OF THE INVENTION

In order to attain the above objects, a solid-state camera device according to the present invention comprises a plurality of light-receiving parts arranged at a constant interval on a substrate, and a plurality of light-focusing parts disposed corresponding to each of the plurality of light-receiving parts so that the incident light is focused on the plurality of light-receiving parts, wherein the position of each of the light-focusing parts is shifted gradually larger toward the center of the camera region based on the position of the corresponding light-receiving part, and the size of the light-focusing part becomes gradually larger in the direction along the substrate, as the location of the light-focusing part is getting closer to the peripheral region from the middle of the camera region on the substrate in the front of the exit pupil.

DETAILED DESCRIPTION OF THE INVENTION

Figure 1:
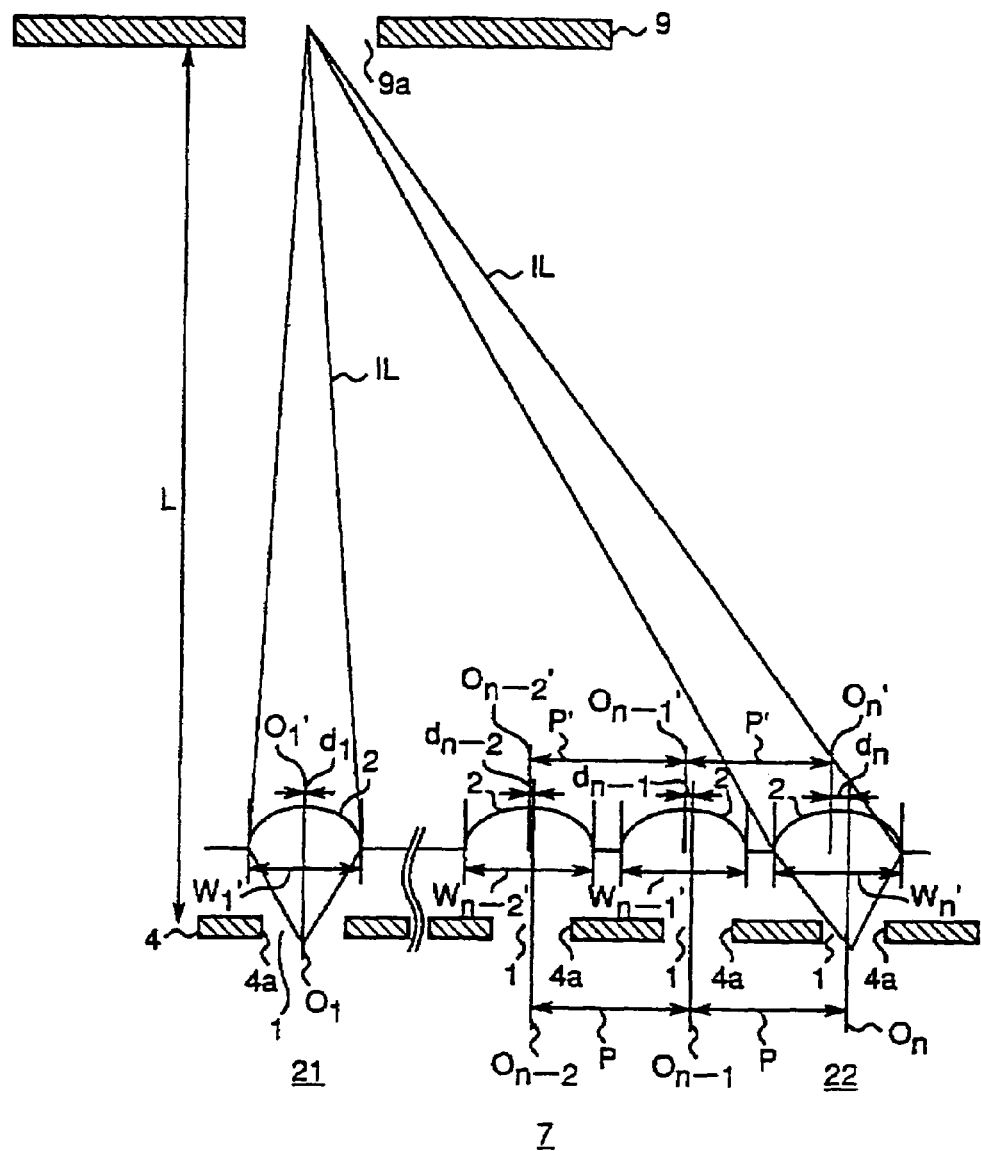
FIG. 1 is a cross-sectional view showing one embodiment of the solid-state camera device according to the present invention.

In the solid-state camera device according to the present invention, the position of each of the light-focusing parts is shifted toward the center of the camera region based on the position of the corresponding light-receiving part, as the location of the light-focusing part is getting closer to the peripheral camera region from the middle of the camera region in the front of the exit pupil on the substrate. Therefore, the present solid-state camera device can correct the shading caused by the eclipse of the incident light as the solid-state camera device in FIG. 9. Further, in the present solid-state camera device, the size of the light-focusing part in the direction along the substrate surface becomes gradually larger, as the location of the light-focusing part is getting closer to the peripheral region from the middle of the camera region on the substrate in the front of the exit pupil. Consequently, as the location of the light-focusing part is getting closer to the peripheral region from the middle of the camera region on the substrate in the front of the exit pupil, the region of the light-focusing part in the direction along the substrate surface becomes gradually larger, that is, the quantity of light focused by the light-focusing part is gradually increased. Therefore, the reduction in the light quantity cased by the rim darkening can be suppressed. Then, the shading caused by the rim darkening can be corrected.

In one embodiment of the present solid-state camera device, the direction from the center of the camera region to the peripheral camera region corresponds to the lateral direction of the solid-state camera device.

In this solid-state camera device, the position of each of the light-focusing parts is shifted gradually larger toward the center of the camera region based on the position of the corresponding light-receiving part and the size of the light-focusing part in the direction along the substrate surface becomes gradually larger, as the location of the light-focusing part is getting closer to the peripheral camera region in the lateral direction. Thus, the shading in the lateral direction of the solid-state camera device can be effectively corrected.

In one embodiment of the present solid-state camera device, the direction from the center of the camera region to the peripheral camera region corresponds to the longitudinal direction of the solid-state camera device.

In this solid-state camera device, the position of each of the light-focusing parts is shifted gradually larger toward the center of the camera region based on the position of the corresponding light-receiving part and the size of the light-focusing part in the direction along the substrate surface becomes gradually larger, as the location of the light-focusing part is getting closer to the peripheral camera region in the longitudinal direction. Thus, the shading in the longitudinal direction of the solid-state camera device can be effectively corrected.

The method of manufacturing a solid-state device according to the present invention is a method of manufacturing the present solid-state camera device, which comprises at least a step of forming a film of a composition for a light-focusing part on a semi-conductor substrate on which a plurality of light-receiving parts have been formed and a step of patterning the above film for the light-focusing parts by exposing it with a specified mask and developing it, wherein the above mask is composed of a transparent substrate on which closed region patterns are disposed, having positions and sizes corresponding to those of the above light-focusing parts.

According to the present method of manufacturing a solid-state camera device, due to the mask pattern, the present solid-state camera device can be manufactured by using completely the same process as that of manufacturing conventional solid-state camera device. That is, in a process of exposing the film of the composition for the light-focusing part, exposure may performed one time with one mask as in the conventional exposing process. Therefore, the productivity of the solid-state camera device is not reduced.

The method of manufacturing a mask according to the present invention is a method of forming a shading film on a transparent substrate and patterning the film with an electron beam exposure apparatus, wherein first mask patterning data which define a plurality of first closed region patterns arranged on a flat surface at a constant interval and second mask patterning data which define a plurality of closed region patterns arranged on the same surface at the same interval as those for the first data so as to overlap with the corresponding first mask patterns are set at a predetermined minimum size unit, respectively, and the first closed region pattern is modified with a first modification scale and, at the same time, the second closed region pattern is modified with a second modification scale, referring to the center of an array of the above closed region patterns with an electron beam exposure apparatus, and wherein patterns are formed on the shading film, in which the position of each of the overlapped regions between each of the first closed region patterns and the corresponding second closed region patterns is shifted gradually larger toward the middle of the array based on the corresponding position before the modification, and the size of the overlapped region becomes gradually larger, as the location of the overlapped region is getting closer to the peripheral region from the middle of the array.

According to the method of manufacturing a mask according to the present invention, a pattern is formed on the shading film, wherein the minimum size units for the first and the second mask patterning data are set to be usual values of about 0.1-0.01 μm, and the position of each of the overlapped regions between the first and the second closed region patterns is shifted gradually larger toward the middle of the array based on the position before the modification, and the size of the overlapped region becomes gradually larger, as the location of the overlapped region is getting closer to the peripheral region. Consequently, the overlapped region having a substantially very small minimum size unit (at largest 0.0001 μm) is formed (mask patterning data). Therefore, a mask for microlens formed in the substantial very small minimum size unit can be easily obtained without using an elaborate and complicated operation for data preparation.

One embodiment of the method of manufacturing a mask is characterized in that in a solid-state camera device having a plurality of light-receiving parts arranged in a constant interval on a substrate and a plurality of light-focusing parts formed corresponding to each of the plurality of the light-receiving parts so that the incident light is focused on the light-receiving parts, the aforementioned first and second scales are defined depending on the drift of the light-focusing part based on the corresponding light-receiving part and the change in the size of the light-focusing part in the direction along the substrate surface, which are required when the position of each of the light-focusing parts is getting closer to the peripheral camera region from the middle of the camera region along the substrate surface.

In the above type of a solid-state camera device, generally, simulations and measurements are performed to optimize the drift of the light-focusing part based on the corresponding light-receiving part and the change in the size of the light-focusing part in the direction along the substrate surface, which are required when the position of each of the light-focusing parts is getting closer to the peripheral camera region from the middle of the camera region along the substrate surface. Then, the first and the second scales are defined depending on the optimized values for the drift and the size change in the present mask manufacturing method. Thus, any modifications are not required on the first and the second mask patterning data before modification by an electron beam exposure apparatus. Consequently, any masks for microlens adapted to a variety of practical solid-state camera devices can be easily manufactured by using a common mask patterning data without preparing individual mask patterning data one by one.

PREFERRED EMBODIMENTS OF THE INVENTION

The present invention will be explained in details by the following embodiments.

Figure 6:
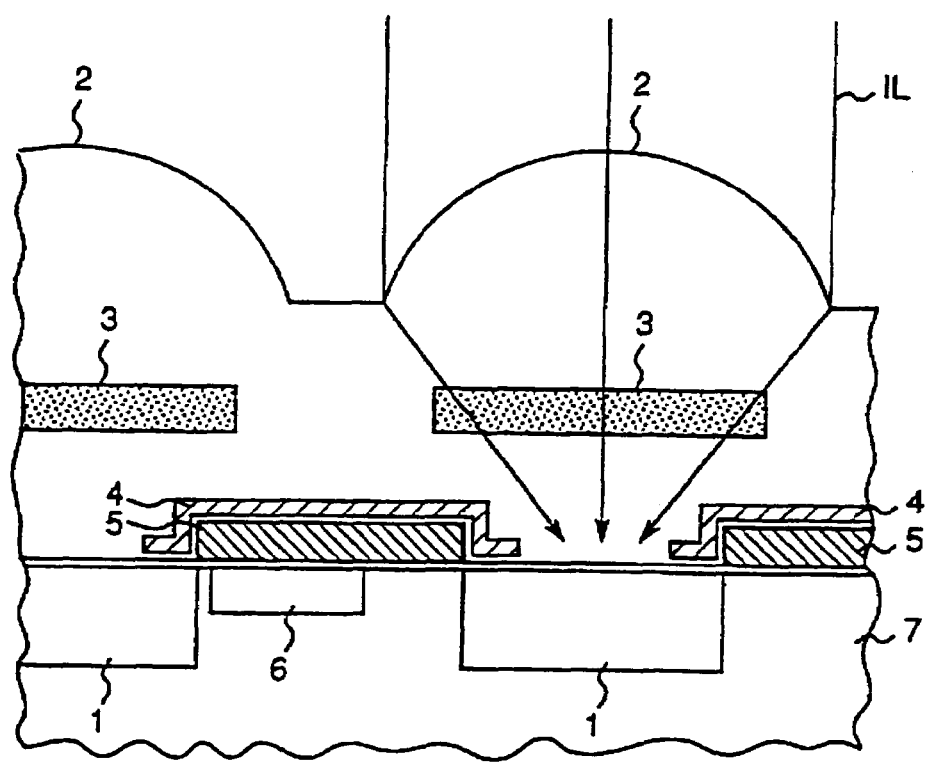
FIG. 6 is a cross-sectional view showing the prior art solid-state camera device.
Figure 7:
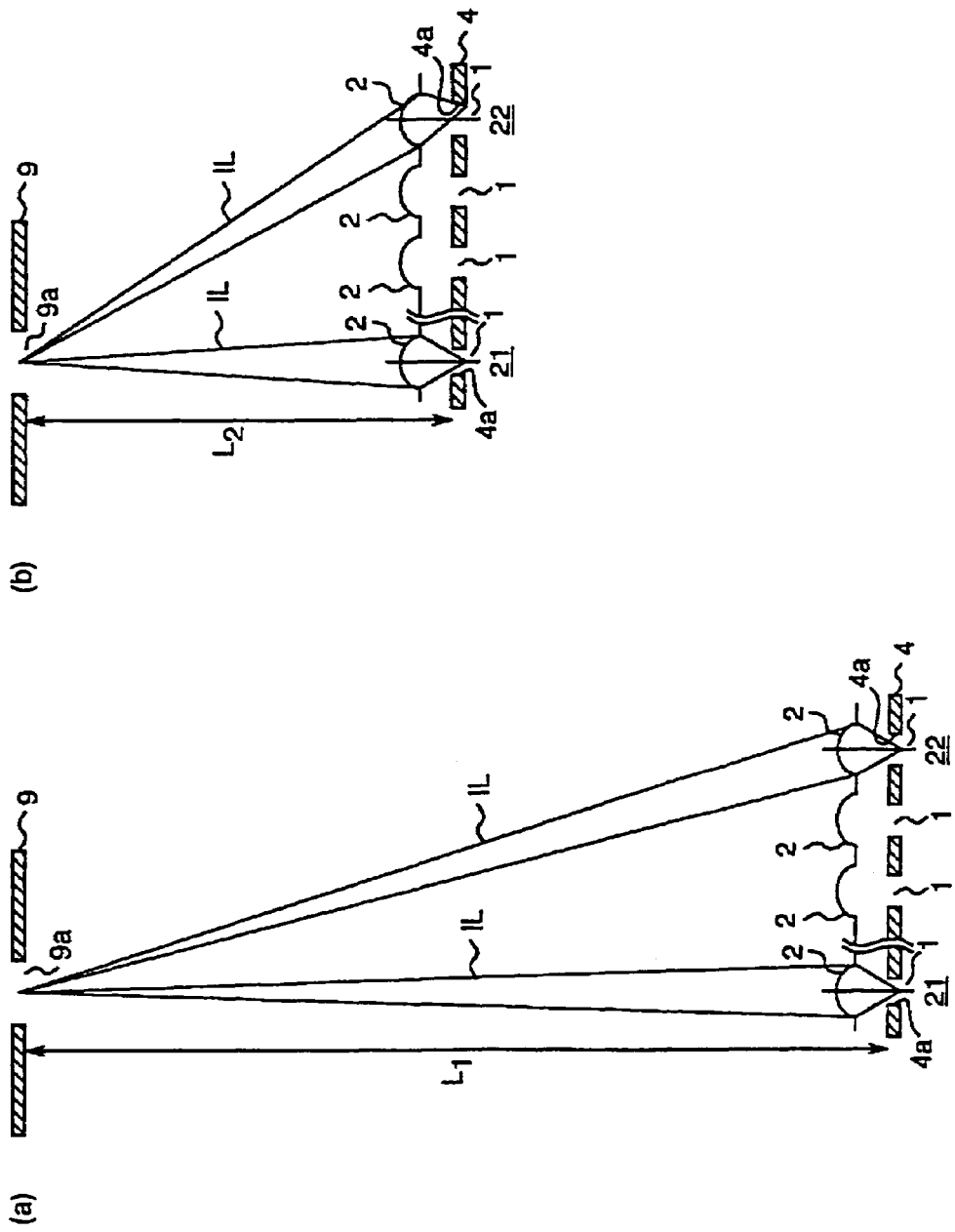
FIG. 7 is a view explaining the characteristics of the prior art solid-state camera device by comparing (a) in the case where the exit pupil distance is relatively long and (b) in the case where the exit pupil distance is relatively short.

One embodiment of the solid-state camera device according to the present invention has the essential features that are generally identical with those of the solid-state camera device shown in FIG. 6 except for the position and the size of the generally hemispherical microlens 2 as a light-focusing part. FIG. 1 schematically indicates a horizontal cross-section for such embodiment of the solid-state camera device. For simplicity, the same components as those of the device in FIG. 6 are represented by the same numbers, respectively, and explanations therefor are omitted.

In this solid-state camera device, the interval between the microlenses 2 (P') is smaller than the interval between the light-receiving parts 1 (i.e., opening 4*a*) (P) (P'<P) based on the center of a camera region (O) in the middle of the camera region 21 on a substrate 7 in the front of the exit pupil 9*a*. Specifically, the center of the light-receiving part 1 (hereinafter, referred to as "light-receiving center") $O_1$ coincides with the center of the microlens 2 (hereinafter, referred to as "microlens center") $O_1'$. The position of each of the microlenses 2 is shifted gradually larger toward the center of the camera region O on the basis of the position of the light-receiving parts 1 corresponding to the respective microlenses 2, as the position of each of the microlens is getting closer to the peripheral camera region 22 from the middle of the camera region 21 along the substrate surface. That is, when the distance between a light-receiving center at nth ($O_n$) and a microlens center at nth ($O_n'$) is represented by $d_n$, the following relationship holds.

$$0=d_1<\ldots<d_{n-2}<d_{n-1}<d_n$$

Figure 9:
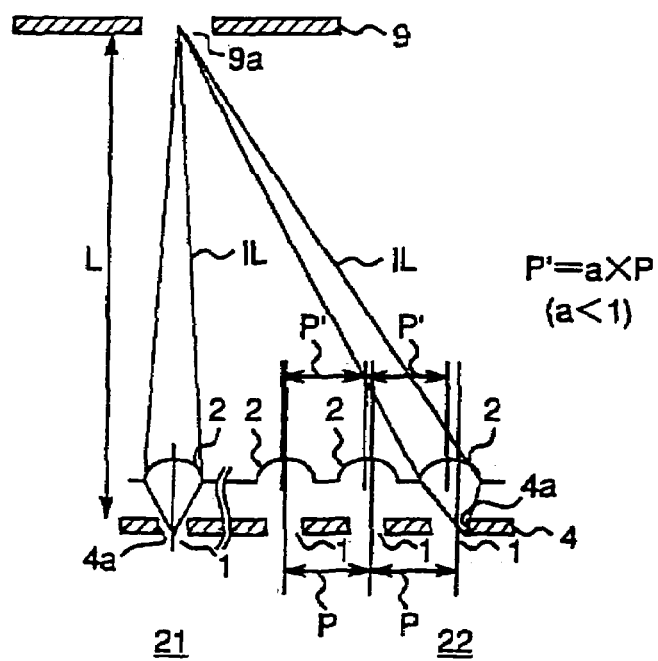
FIG. 9 is a view showing improvement of the conventional solid-state camera device in FIG. 6, wherein the position of each of the light-focusing parts is shifted gradually larger toward the center of the camera region based on the position of the corresponding light-receiving parts, as the location of the light-focusing parts is getting closer to the peripheral camera region from the middle of the camera region.

Consequently, the solid-state camera device can correct the shading caused by the eclipse of the incident light as in the solid-state camera device in FIG. 9.

Further, in this solid-state camera device, the size of each of the microlens 2 in the direction along the substrate surface becomes gradually larger, as the location of the microlens is getting closer to the peripheral camera region 22 from the middle of the camera region 21 along the substrate surface. That is, when the size in the lateral direction of a microlens 2 at nth is represented by $W_n'$, the following relationship hold.

$$W_1'<\ldots<W_{n-2}'W_{n-1}'<W_n'$$

Consequently, as the location of the microlens 2 is getting closer to the peripheral region 22 from the middle of the camera region 21, the region of each of microlenses 2 becomes gradually larger and, whereby, the quantity of light focused by each of the plurality of microlenses 2 is gradually increased, which can compensate for the reduction in the light quantity of the incident light IL caused by the rim darkening. As a result, the shading caused by the rim darkening can be improved.

Additionally, although the above embodiment was described in a lateral direction, the same essential features may be applied in the longitudinal direction or both in the lateral direction and in the longitudinal direction.

A process of forming the microlens 2 will be described below. First, a transparent film of a composition for the microlenses, having photo-sensitivity and thermoplasticity is formed by applying the composition on the substrate 7 on which the shading film 4 and the color filters 3 have been arranged. Next, the film is exposed using a specified mask and developed to be patterned. Then, the patterned film is softened by heat treatment to make the patterns generally hemispherical. The above mask to be used is composed of a transparent glass substrate on which closed region shading patterns are disposed, as having positions and sizes corresponding those of the microlenses 2. In this case, the solid-state camera device in FIG. 1 can be manufactured by using entirely the same process as that of manufacturing the conventional masks. That is, in a process of exposing the film of the composition for the microlenses 2, exposure may be performed one time with one mask as in the conventional exposing process. Therefore, the productivity of the solid-state camera device is not deteriorated.

A mask for manufacturing this kind of solid-state camera device is usually manufactured by using electron beam lithography. Generally, first, a shading film (in this embodiment, a Cr film) is laminated all over one side of a transparent substrate composed of glass etc., then, a film of a composition for an electron beam resist is formed thereon. Next, a desired pattern is made on the above resist film by using a computer-controlled electron beam exposure apparatus. Finally, after developing the patterned resist film, the uncovered region of the Cr film is removed by etching using the pattern of the remaining resist film as a mask.

The above pattern is represented by digital data (hereinafter, referred to as "mask patterning data"), wherein a minimum size unit therefor is set depending on required accuracy of microfabrication and line width. In the mask for manufacturing the solid-state camera device in FIG. 6, the minimum size unit for the mask patterning data is usually set to be around 0.1-0.01 μm.

However, in a mask for forming microlenses of the present solid-state camera device, i.e., a mask that forms a plurality of microlenses 2 with gradually varying locations and sizes in the lateral direction along the substrate surface (hereinafter, referred to as "the present mask"), an extremely small amount of the size change (<0.001 μm) is required for preparing mask patterning data. That is, it is required that the minimum size unit of the mask patterning data is at largest 0.0001 μm. For example, when the present invention is applied to a solid-state camera device having 1,000 pixels in the lateral direction, a 5-μm pixel interval in the lateral direction, and a 4-μm microlens width in the lateral direction so that the distance between the center of a microlens and the center of a corresponding light-receiving part in the lateral direction is 0.3 μm and the microlens width in the lateral direction is 4.2 μm at the most left and right ends of the camera region, the interval and the size (width) difference between the adjoining microlenses are calculated to be 4.9994 μm and 0.0004 μm, respectively.

For this reason, it becomes extremely elaborate and complicated to directly prepare patterning data for the present mask. In addition, since the minimum size unit for the mask patterning data is extremely small, the data amount becomes enormous and the processing time becomes very long in an electron beam exposure apparatus. Consequently, this would cause a reduction in a throughput for designing and manufacturing masks, which in turn may result in a reduction in the productivity of the solid-state camera device.

A commercially available electron beam exposure apparatus can modify patterning data at a specified scale (or resize at a specified amount) depending on purposes. Therefore, a mask for microlenses of the solid-state camera device in FIG. 9 can be manufactured relatively easily in the above electron beam exposure apparatus to make by patterning by using mask patterning data which generate the same pattern as that of a mask for the microlens in FIG. 6 and performing a slight-scaling technique (e.g., scale a=0.9999). However, since the present mask is characterized in that the position of each of the microlenses 2 is shifted gradually larger toward the center of the camera region O based on the position of the corresponding light-receiving parts 1 and the size of each of the microlenses 2 becomes larger, as the location of the microlens 2 is getting closer to the peripheral camera region 22 from the middle of the camera region 21, it is impossible to manufacture the mask only by performing a slight-scaling (or resizing) in a commercially available electron exposure apparatus. Thus, the following method of manufacturing a mask was devised in the present invention.

EXAMPLE 1

Figure 2:
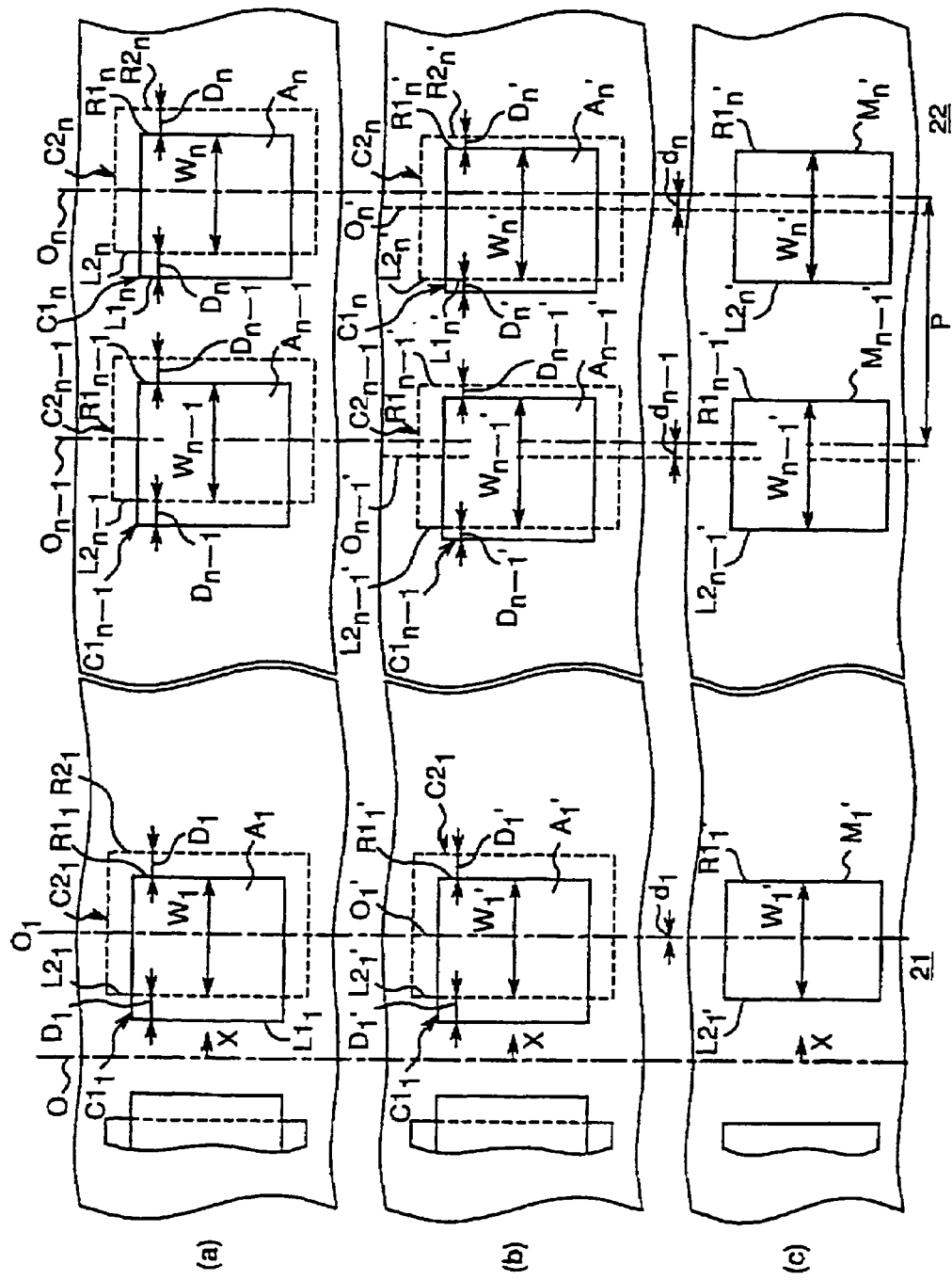
FIG. 2(a) is a view showing the mask patterning data which are firstly prepared when the method of manufacturing a mask according to the present invention is applied in the lateral direction; (b) is a view showing the mask patterning data after modification of the mask patterning data in (a); and (c) is a view showing the mask pattern for microlenses obtained by the mask patterning data in (b).

FIG. 2 explains an example in which the method of manufacturing a mask according to the present invention is applied in the lateral direction (X-direction). Specifically, FIGS. 2(a), (b) and (c) illustrate one line of a pattern (mask patterning data) in the lateral direction from the middle of the camera region 21 to the peripheral camera region 22 (right end), respectively, wherein the X-coordinate of the center of the camera region O is defined to be 0. Additionally, the left part of the pattern is not illustrated in the figure because the mask pattern is symmetrical.

Step 1

First, the first mask patterning data and the second mask patterning data are prepared at respective minimum size units as usual (e.g., 0.01 μm) to define, in the first data, a plurality of rectangular regions, $C1_1, \ldots, C1_{n-1}, C1_n$ (represented by solid lines; hereinafter, referred to as "first rectangular region") aligning in a line at a constant interval P in the lateral direction and, in the second data, a plurality of rectangular regions, $C2_1, \ldots, C2_{n-1}, C2_n$ (represented by broken lines; hereinafter, referred to as "second rectangular region") aligning in a line at a constant interval P in the lateral direction so that each of the rectangular regions of the second data overlaps the corresponding rectangular region of the fist data, respectively, on a plane as shown in FIG. 2(a). In this example, each of the first rectangular regions defined by the first mask patterning data and each of the second rectangular regions defined by the second mask patterning data have a common width in the lateral direction (lateral width). Further, each of overlapped regions, $A_1, \ldots, A_{n-1}, A_n$, between each of the fist rectangular regions and each of the second rectangular regions (those lateral widths are represented by $W_1, \ldots, W_{n-1}, W_n$) correspond to a pattern of microlenses 2 to be modified.

Additionally, middle points between each of coordinates of the left ends, $L2_1, \ldots, L2_{n-1}, L2_n$, and each of coordinates of the right ends, $R1_1, \ldots, R1_{n-1}, R1_n$, for the overlapped regions, $A_1, \ldots, A_{n-1}, A_n$, correspond to X-coordinates, $O_1, \ldots, O_{n-1}, O_n$ of the center of the respective light-receiving parts 1 aligning on the substrate. The middle points are set to correspond to the X-coordinates, $O_1, \ldots, O_{n-1}, O_n$ in order to simplify the computational treatment discussed below, but it is not necessarily required. Further, a distance in the lateral direction $D_n$ between a fist rectangular region $C1_n$ and a second rectangular region $C2_n$ is set so that all of the overlapped regions, $A_1, \ldots, A_{n-1}, A_n$, always exist (are not lost) when the following slight-scaling (modification treatment) is performed (this will be quantitatively discussed later).

Step 2

Next, as shown in FIG. 2(b), the first mask patterning data are slightly scaled at a modification scale α1 (α1<1) with referring to the center of the camera region O, and an electron beam resist composition on a transparent substrate is exposed by a commercially available electron beam exposure apparatus using the modified fist mask patterning data. In this case, the exposure settings are made to expose the outside of the first rectangular regions, $C1_1', \ldots, C1_{n-1}', C1_n'$, and not to expose the inside of the above regions. The modified patterns are represented by symbols with "'", hereinafter. Subsequently, the second mask patterning data are slightly scaled at a modification scale α2 (α2<1) with referring to the center of the camera region O, and the same electron beam resist composition is exposed by using the modified second mask patterning data (modification scales will be described later). In this case, the exposure settings are made to expose the outside of the second rectangular regions, $C2_1', \ldots, C2_{n-1}', C2_n'$, and not to exposure the inside of the above regions. Consequently, overlapped regions, $A_1', \ldots, A_{n-1}', A_n'$, between the first rectangular regions, $C1_1', \ldots, C1_{n-1}', C1_n'$, and the second rectangular regions, $C2_1', \ldots, C2_{n-1}', C2_n'$, are never exposed in either exposure treatment. Therefore, a resist film remains on the overlapped regions after developing, and the Cr film under the remaining resist film is retained after the subsequent etching treatment. Thus, a mask is obtained, wherein Cr film regions corresponding to the above overlapped regions, $A_1', \ldots, A_{n-1}', A_n'$, i.e., patterns for microlenses, $M_1', \ldots, M_{n-1}', M_n'$, are arranged on a transparent substrate, as shown in FIG. 2(c).

Thus, a mask for microlens, which is made at a substantially very small minimum size unit (at largest 0.0001 μm), can be obtained easily without carrying out any elaborate and complicated data preparation.

Here, in respect of the nth pattern of microlens $M_n'$ in the peripheral camera region 22 (on the right side of FIG. 2(c)), a lateral distance $d_n$ (drift) between the center of the light-receiving part $O_n$ and the center $O_n'$ of the pattern $M_n'$, and the lateral width $W_n'$ of the pattern $M_n'$ will be theoretically obtained.

It is seen from FIG. 2(a) that there are the following relationships:

$$L2_n = L2_1 + P(n-1)$$
$$R1_n = R1_1 + P(n-1)$$
$$O_n = (L2_n + R1_n)/2$$
$$W_n = \{R1_1 + P(n-1)\} - \{L2_1 + P(n-1)\}$$
$$= R1_1 - L2_1 = W_1$$

Further, in FIG. 2(b), there are the following relationships:

$$L2_n' = \alpha 2 \times L2_n$$
$$R1_n' = \alpha 1 \times R1_n$$
$$O_n' = (L2_n' + R1_n')/2.$$

Therefore, the following formulae are obtained.

$$W_n' = R1_n' - L2_n' = \alpha 1 \times R1_n - \alpha 2 \times L2_n \quad (1)$$

$$d_n = O_n - O_n' \quad (2)$$
$$= \{(L2_n + R1_n) - (L2_n' + R1_n')\}/2$$
$$= \{(1-\alpha 2)L2_n + (1-\alpha 1)R1_n\}/2.$$

Next, there are the following relationships $$d_n - d_{n-1} = \{(1-\alpha 2)(L2_n - L2_{n-1}) + (1-\alpha 1)(R1_n - R1_{n-1})\}/2 \quad (3)$$
$$= (2 - \alpha 2 - \alpha 1)P/2$$

$$W_n' - W_{n-1}' = \alpha 1(R1_n - R1_{n-1}) - \alpha 2(L2_n - L2_{n-1}) \quad (4)$$
$$= (\alpha 1 - \alpha 2)P$$

between the pattern for the nth microlens $M_n'$ and the pattern for the (n−1)th microlens $M_{n-1}'$. It is seen from formulae (3) and (4) that in the comparison of the adjoining patterns for microlenses $M_n'$ and $M_{n-1}'$, variations both in the distance (d) (drift) between the center of the light-receiving part and the center of the pattern for microlens and in the lateral width (W) of the pattern for microlens are constant, regardless of the n value.

Now, it has been theoretically demonstrated that in the mask made by the method according to the present invention, the position of the center $O_n'$ of the pattern for microlens $M_n'$ is shifted gradually larger toward the center of the camera region and the lateral width $W_n'$ of the pattern for microlens $M_n'$ becomes gradually larger, as the location of the microlens is getting closer to the peripheral camera region 22 from the middle of the camera region 21 along the substrate surface.

In addition, it is required that modification scales α1 and α2 be predetermined prior to exposure by the above method using an electron beam exposure apparatus. Therefore, $W_n'$ and $d_n$ are optimized in advance by simulations and measurements and, then, the modification scales α1 and α2 are calculated based on the optimized $W_n'$ and $d_n$ by using the above formulae (1) and (2). Thereby, the optimum values for the scales α1 and α2 can be inputted into an electron beam exposure apparatus. Since a degree of the shading varies depending on various factors such as an optical system lens and an eye point distance for a practical camera, simulations or measurements are needed to determine modification scales suitable for the optical system lens and the eye point distance of the practical camera. Thus, any modifications are not required on the first and the second mask patterning data before modification by an electron beam exposure apparatus. Consequently, any masks for microlens adapted to a variety of practical solid-state camera devices can be easily manufactured by using common mask patterning data without preparing individual mask patterning data one by one.

Further, the distance $D_n'$ after the modification (equivalent to the distance between $L2_n'$ and $L1_n'$, or the distance between $R2_n'$ and $R1_n'$) is required to set so that all of the overlapped regions, $A_1, \ldots, A_{n-1}, A_n$, always exist when the above slight-scaling (modification treatment) is performed. In addition, it is required that the distance $D_n'$ after the modification is set to be above a value A that has been determined based on accuracy of superposition between the first rectangular region $C1_n$ and the second rectangular region $C2_n$ in the patterning step and the line width change from the mask patterning data in the process of the development of the electron beam resist composition and etching of the Cr film. Therefore, positions of $L1_n$, $L2_n$, $R1_n$ and $R2_n$ are set so as to satisfy the following formulae:

$$D_n' = L2_n' - L1_n' = (\alpha 2 \times L2_n - \alpha 1 \times L1_n) > A \quad (5)$$

$$D_n' = R2_n' - R1_n' = (\alpha 2 \times R2_n - \alpha 1 \times R1) > A \quad (6).$$

In this Example, since the formula: $D_1' > \ldots > D_{n-1}' > D_n'$ holds, the formulae (5) and (6) are always satisfied for all the n values as long as the value of $D_n'$ satisfies the formulae (5) and (6). Thus, each of the overlapped regions, $A_1', \ldots, A_{n-1}', A_n'$, is obtained as each of the desired pattern for microlenses, $M_1', \ldots, M_{n-1}', M_n'$.

Additionally, in this example, the first rectangular region $C1_n$ and the second rectangular region $C2_n$ have a common lateral width, therefore, the differences $D_n$ (or $D_n'$) generated in the both sides of the overlapped region $A_n$ (or $A_n'$) are equivalent to each other. However, as long as the value of $D_n$ (or $D_n'$) satisfies the formulae (5) and (6), the first rectangular region $C1_n$ and the second rectangular region $C2_n$ may have different lateral widths for each other.

When the mask for microlens obtained by the present method is used, exposure may performed one time with one mask in a process of exposing the film of the composition for the microlenses as in the conventional exposing process. Therefore, productivity of the solid-state camera device is not deteriorated. Further, the solid-state camera device according to the present method can improve not only the shading caused by the eclipse of the incident light but also the shading caused by the rim darkening in the lateral direction.

In the above, described is the embodiment wherein the method of manufacturing a mask according to the present invention is applied in the lateral direction (X-direction)

Naturally, the present invention may be applied in the longitudinal direction according to entirely the same manner as that in the lateral direction.

EXAMPLE 2

Figure 3:
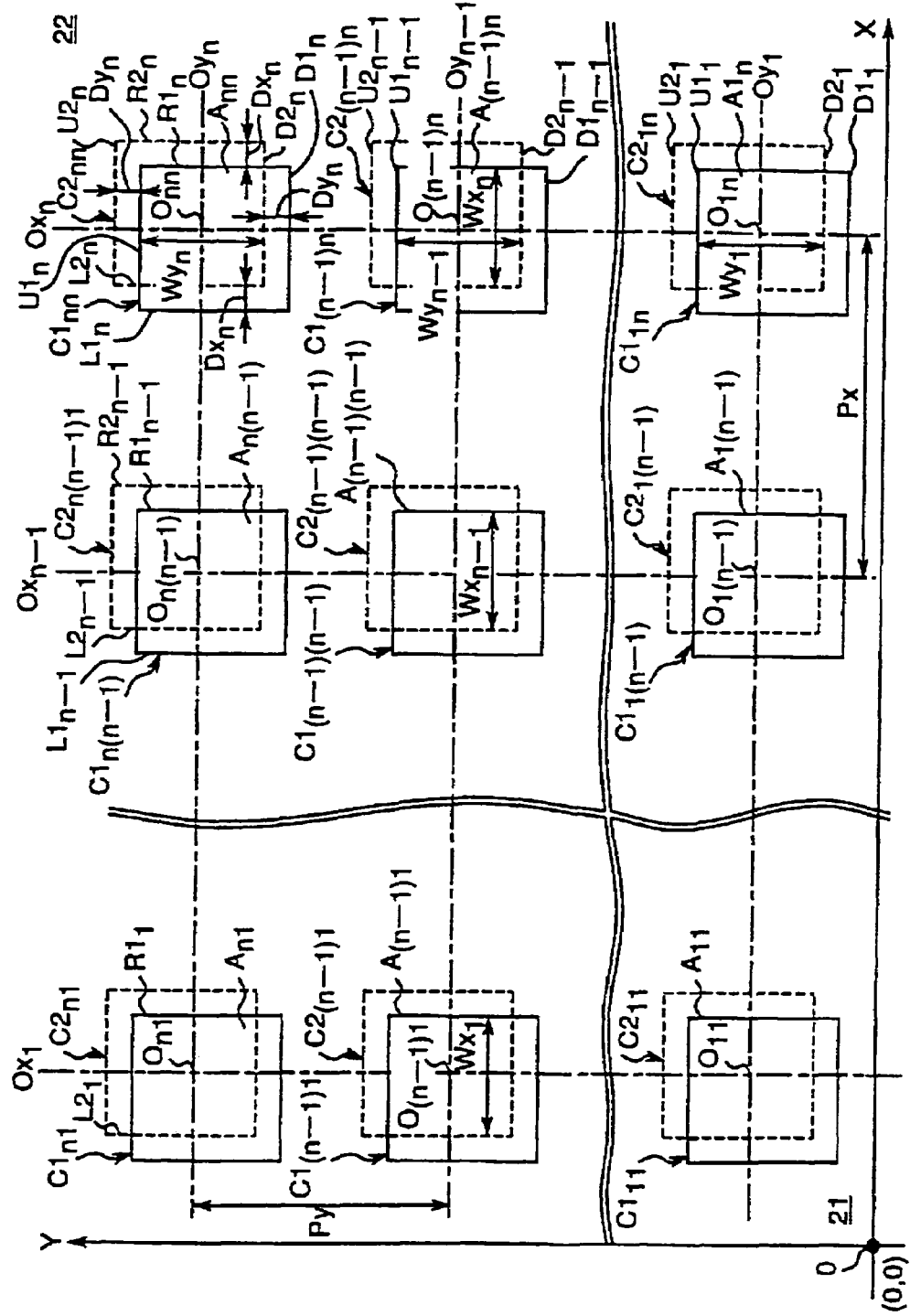
FIG. 3 is a view showing the mask patterning data which are firstly prepared when the method of manufacturing a mask according to the present invention is applied both in the lateral direction and in the longitudinal direction.
Figure 4:
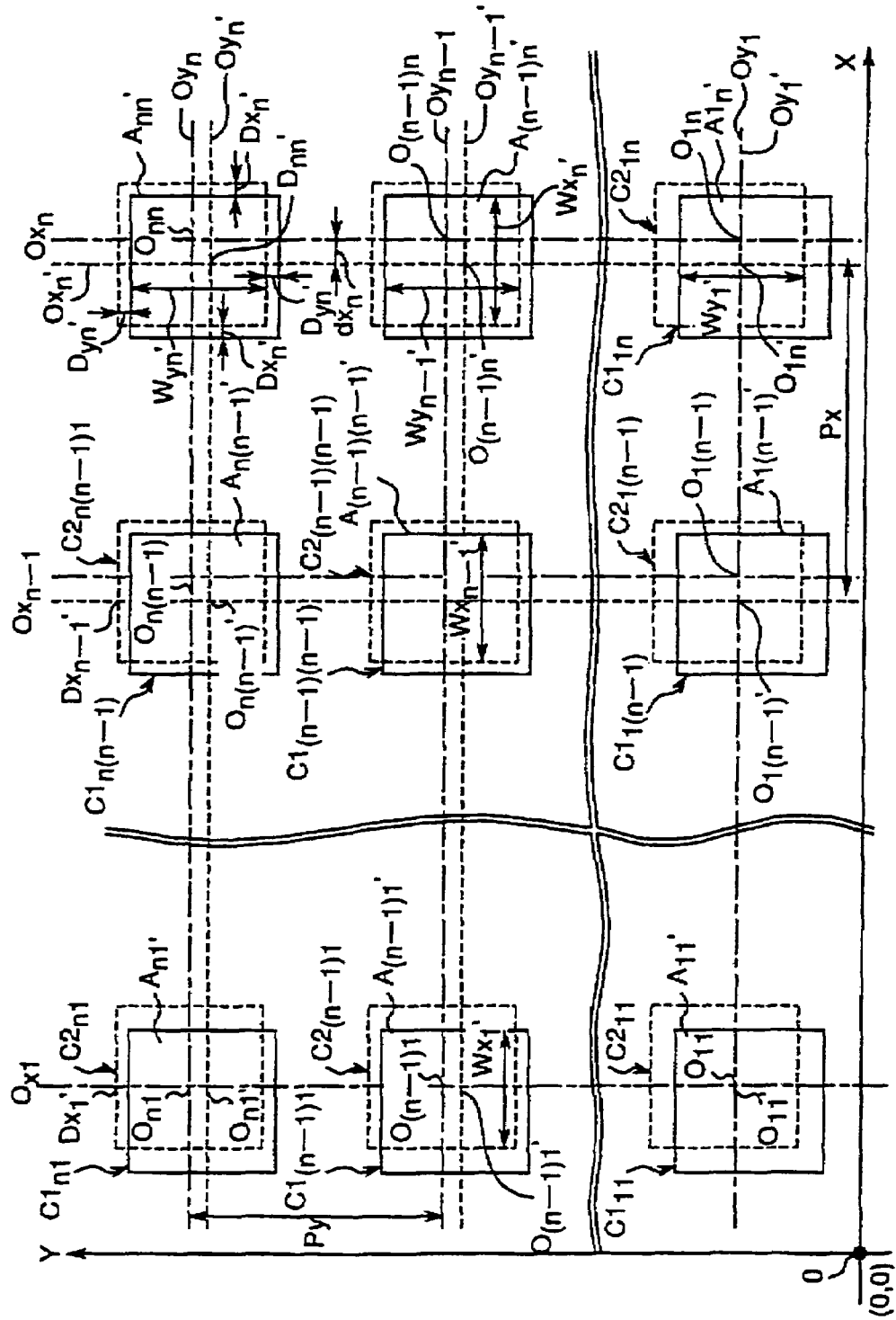
FIG. 4 is a view showing the mask patterning data after modification of the mask patterning data in FIG. 3.
Figure 5:
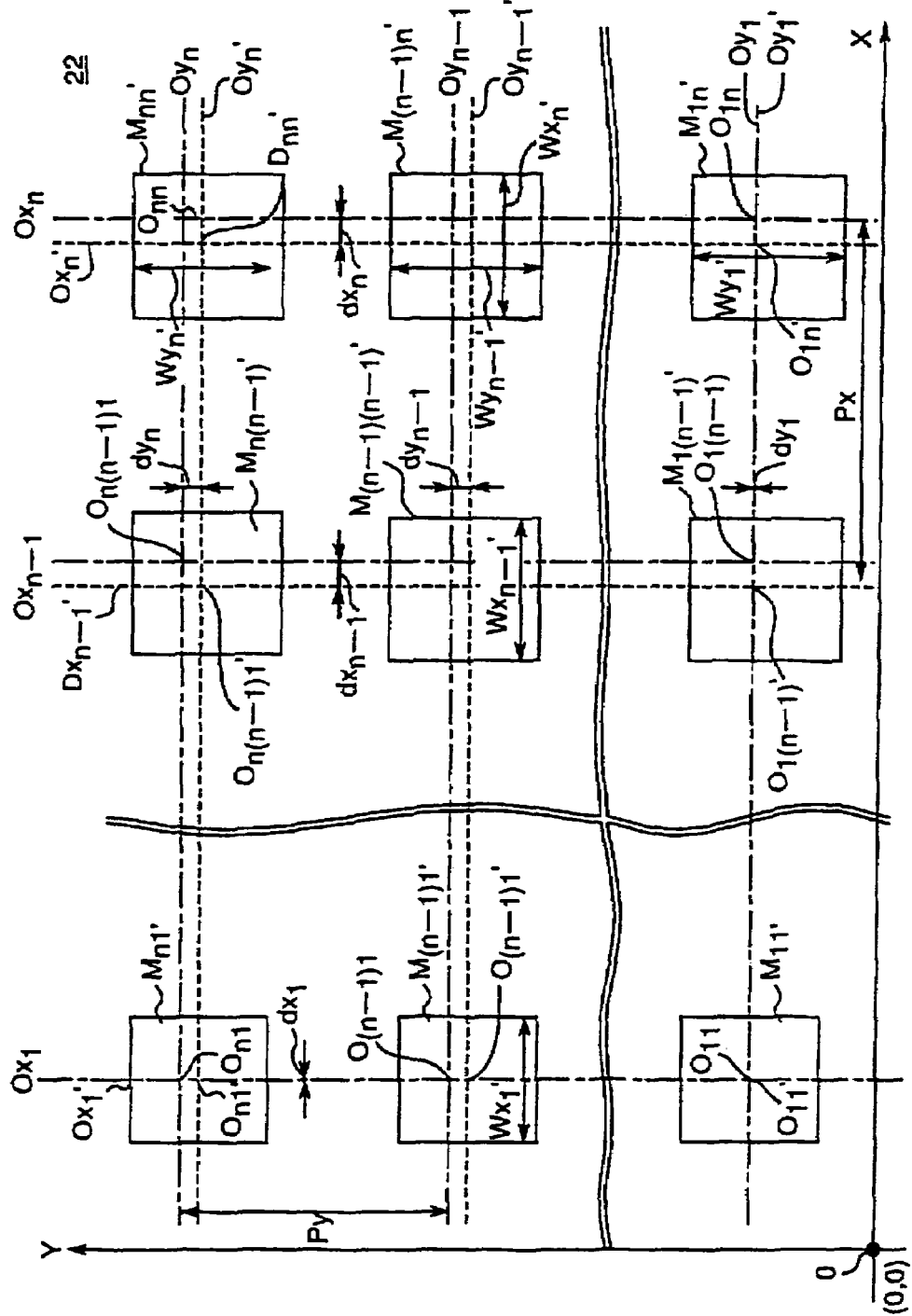
FIG. 5 is a view showing the mask pattern for microlenses obtained by the mask patterning data in FIG. 5.

Next, FIGS. 3 through 5 explain another example in which the method of manufacturing a mask according to the present invention is applied both in the lateral direction (X-direction) and in the longitudinal direction (Y-direction). More particularly, FIGS. 3 through 5 illustrate a pattern (mask patterning data) of a one-fourth part of the whole camera region including the middle of the camera region 21 and the peripheral camera region 22 (right end, upper end), wherein the X- and Y-coordinates of the center of the camera region O is defined to be (0, 0). Additionally, a pattern of the remaining three-fourth part is omitted because the mask pattern is symmetrical.

Step 1

First, the first mask patterning data and the second mask patterning data are prepared at respective minimum size units as usual (e.g., 0.01 µm) to define, in the first data, a plurality of rectangular regions, $C1_{11}, \ldots, C1_{n(n-1)}, C1_{nn}$ (represented by solid lines; hereinafter, referred to as "first rectangular region") aligning in a matrix at constant intervals Px and Py in the lateral direction, and the longitudinal direction, respectively, and, in the second data, a plurality of rectangular regions, $C2_{11}, \ldots, C2_{n(n-1)}, C2_{nn}$ (represented by broken lines; hereinafter, referred to as "second rectangular region") aligning in a matrix manner at constant intervals Px and Py in the lateral direction and the longitudinal direction, respectively, so that each of the rectangular regions of the second region overlaps with the corresponding first region, on a plane as shown in FIG. 3. In this Example, each of the first rectangular regions defined by the first mask patterning data and each of the second rectangular regions defined by the second mask patterning data have a common width in the lateral direction (lateral width) and they have a common width in the longitudinal direction (longitudinal width). For example, the first rectangular region $C1_{nn}$ is defined by a left end $L1_n$, a right end $R1_n$, an upper end $U1_n$ and a lower end $D1_n$, and the second rectangular region $C2_n$ is defined by a left end $L2_n$, a right end $R2_n$, an upper end $U2_n$ and a lower end $D2_n$. Further, each of overlapped regions, $A_{11}, \ldots, A_{n(n-1)}, A_{nn}$, between each of the fist rectangular regions and each of the second rectangular regions (those lateral widths are represented by $Wx_1, \ldots, Wx_{n-1}, Wx_n$, and those longitudinal widths are represented by $Wy_1, \ldots, Wy_{n-1}, Wy_n$.) correspond to a pattern of microlenses 2 to be modified.

Additionally, center points of the respective overlapped regions, $A_{11}, \ldots, A_{nn(-1)}, A_{nn}$, correspond to the centers of the respective light-receiving parts 1 aligned on the substrate, $O_{11}, \ldots, O_{nn(-1)}, O_{nn}$ (the X-coordinates are defined as $Ox_1, \ldots, Ox_{n-1}, Ox_n$, and the Y-coordinates $Oy_1, \ldots, Oy_{n-1}, Oy_n$). In order to simplify the computational treatment, they are set to correspond to each other, but it is not necessarily required. Further, a drift in the lateral direction $D_n$ between the fist rectangular region $C1_{nn}$ and the second rectangular region $C2_{nn}$ is set so that all of the overlapped regions, $A_{11}, \ldots, A_{n(n-1)}, A_{nn}$, always exist (are not lost) when the following slight-scaling (modification treatment) is performed.

Step 2

Next, as shown in FIG. 4, the first mask patterning data are slightly scaled at a modification scale α1x in the lateral direction and at a modification scale α1y in the longitudinal direction (α1x<1, α1y<1) referring to the center of the camera region O, and an electron beam resist film on a transparent substrate is exposed with a commercially available electron beam exposure apparatus by using the modified fist mask patterning data. In this case, the exposure settings are made to expose the outside of the first rectangular regions, $C1_{11}', \ldots, C1_{n(n-1)}', C1_{nn}'$, and not to expose the inside of the above regions. Subsequently, the second mask patterning data are slightly scaled at a modification scale α2x in the lateral direction and at a modification scale α2y in the longitudinal direction (α2x<1, α2y<1) referring to the center of the camera region O, and the same electron beam resist film is exposed by using the modified second mask patterning data. Additionally, $W_n'$ and $d_n$ are optimized in advance by simulations and measurements and, then, the modification scales α1x, α1y, α2x and α2y are calculated based on the optimized $W_n'$ and $d_n$ by using the above formulae (1) and (2) as in the preceding example. In this case, the exposure settings are made to expose the outside of the second rectangular regions, $C2_{11}', \ldots, C2_{n(n-1)}', C2_{nn}'$, and not to exposure the inside of the above regions. Consequently, overlapped regions, $A_{11}', A_{n(n-1)}', A_{nn}'$, between the first rectangular regions, $C1_{11}', \ldots, C1_{n(n-1)}', C1_{nn}'$, and the second rectangular regions, $C2_{11}', C2_{n(n-1)}', C2_{nn}'$, are never exposed in either exposure. Therefore, the resist film on the overlapped regions remains after developing, and a part of the Cr film under the remaining resist film is retained after the subsequent etching treatment. Thus, a mask is obtained, wherein Cr film regions corresponding to the above overlapped regions, $A_{11}', \ldots, A_{n(n-1)}', A_{nn}'$, i.e., patterns for microlenses, $M_{11}', \ldots, M_{n(n-1)}', M_{nn}'$, are arranged on a transparent substrate, as shown in FIG. 5.

Thus, a mask for microlens, which is made at a substantially very small minimum size unit (at largest 0.0001 µm), can be obtained easily without carrying out any elaborate and complicated data preparation.

When the mask for microlens obtained by the method according to the present invention is used, exposure may be performed one time with one mask in a process of exposing the film of the composition for the light-focusing part as in a conventional exposing process. Therefore, productivity of the solid-state camera device is not deteriorated. Further, the solid-state camera device according to the present method can improve not only the shading caused by the eclipse of the incident light but also the shading caused by the rim darkening both in the lateral direction and in the longitudinal direction.

Additionally, although the above pattern for microlenses is rectangular, various shapes other than rectangles may be employed.

Alternatively, the first mask and the second mask are separately made by using the first mask patterning data after the above slight-scaling and the second mask patterning data after the above slight-scaling, respectively, then, the film of the composition for the microlens may be patterned by exposure using the first and the second mask in turn and by development. In this case, it is easy to make the first and the second masks. However, since two masks and two photolithography steps are required, productivity of the solid-state camera device might be deteriorated.

Alternatively, the first mask and the second mask are separately made by using the first mask patterning data before the slight-scaling and the second mask patterning data before the sight-scaling, respectively, then, the film of the composition for the microlens may be patterned by exposure using the first and the second masks at a smaller scale than usual by a reducing projection exposure apparatus (so-called "a stepper"). In this case, it is easy to make the first and the second masks. However, since two masks, two photolithography steps and adjustment of reduction scales are required, a productivity improvement would not be expected. Moreover, since it is impossible to perform the slight-scaling separately either in the lateral direction or in the longitudinal direction, the same reduction (modification) scale must be selected both in the lateral and in the longitudinal directions.

Figure 8:
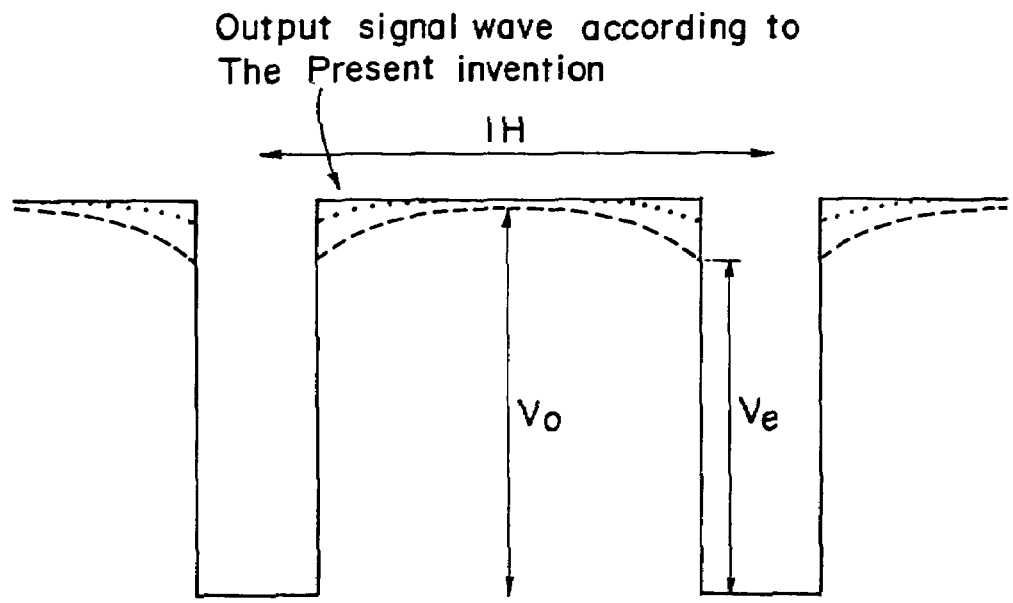
FIG. 8 is a diagram showing the output signal waves of the solid-state camera device of the present invention (solid line) and the prior art solid-state camera device (dotted line and broken line).

It is clear from the foregoing description that the solid-state camera device according to the present invention can improve both the shading caused by the eclipse of the incident light and the shading caused by the rim darkening because the position of each of the light-focusing parts is shifted gradually larger toward the center of the camera region based on the position of the corresponding light-receiving parts and the size along the substrate surface becomes gradually larger, as the location of the light-focusing part is getting closer to the peripheral camera region from the middle of the camera region. A solid line in FIG. 8 indicates that both the shading caused by the eclipse and the shading caused by the rim darkening are significantly improved in comparison with the prior solid-state camera device (the dotted line).

In one embodiment of the present solid-state camera device, since the direction from the center of the camera region to the peripheral camera region corresponds to the lateral direction of the solid-state camera device, the shading in the lateral direction of the solid-state camera device can be effectively improved.

In one embodiment of the present solid-state camera device, since the direction from the center of the camera region to the peripheral camera region corresponds to the longitudinal direction of the solid-state camera device, the shading in the longitudinal direction of the solid-state camera device can be effectively corrected.

According to the present method of manufacturing a solid-state camera device, the above solid-state camera device can be manufactured by using completely the same processes as those used for manufacturing a conventional solid-state camera device. That is, exposure may be performed one time with one mask in a process of exposing the film of the composition for the light-focusing part as in a conventional exposing process. Therefore, productivity of the solid-state camera device is not deteriorated.

According to the present method for manufacturing a mask, a pattern is formed on the shading film, wherein the minimum size units for the first and the second mask patterning data are set to be usual values of about 0.1-0.01 μm, and the position of each of the overlapped regions between the first and the second closed region patterns is shifted gradually larger toward the middle of the array based on the position before the modification, and the size of the overlapped region becomes gradually larger, as the location of the overlapped region is getting closer to the peripheral region. Consequently, the overlapped region having substantially very small minimum size unit (at largest 0.0001 μm) is formed. Therefore, a mask for microlens formed in the substantial very small minimum size unit can be easily obtained without using an elaborate and complicate operation for data preparation.

In one embodiment of the method of manufacturing a mask according to the present invention, any masks for microlens adapted to a variety of practical solid-state camera devices can be easily manufactured by using a common mask patterning data without preparing individual mask patterning data one by one.

What is claimed is:

1. A method of manufacturing a solid-state camera device which comprises a plurality of light-receiving parts arranged at a constant interval on a substrate surface and a plurality of light-focusing parts disposed corresponding to each of the plurality of the light-receiving parts on the substrate surface so that incident light is focused on the light-receiving parts, wherein a position of each of the light-focusing parts is shifted monotonically larger toward a center of the camera region based on the position of each of the light-receiving parts corresponding to the light-focusing parts and a size along the substrate surface in the lateral direction of each of the light-focusing parts becomes gradually larger, as the location of the light-focusing part is getting closer to a peripheral camera region from a middle camera region on the substrate in front of an exit pupil, the method comprising:

forming a film of a composition for the light-focusing parts on a semi-conductor substrate on which the light-receiving parts have been formed, and patterning the film of the composition for the light-focusing parts by exposing it by using a specified mask and by developing, wherein the mask comprises a transparent substrate on which closed region patterns are disposed, said closed region pattern having positions and sizes corresponding to those of the light-focusing parts.

2. A method of manufacturing a mask which comprises, forming a shading film on a transparent substrate and patterning the film with an electron beam exposure apparatus, wherein first mask patterning data which define a plurality of first closed region patterns arranged on a flat surface at a constant inferval and second mask patterning data which define a plurality of closed region patterns arranged on the same surface at the same interval as those for the first data so as to overlap with the corresponding first mask patterns are set at a minimum size unit, and the first closed region pattern is modified with a first modification scale and, at the same time, the second closed region pattern is modified with a second modification scale, based on the middle of an array of the above closed region patterns by an electron beam exposure apparatus and wherein patterns are formed in which the position of each of overlapped regions between each of the first closed region patterns and the corresponding second closed region patterns is shifted gradually hirger toward the middle of the array based on the corresponding position before the modification, and the size of the overlapped region becomes gradually larger, as the location of the overlapped region is getting closer to the peripheral region from the middle of the array.

3. The method of manufacturing a mask according to claim 2, wherein in a solid-state camera device having a plurality of light-receiving parts arranged in a constant interval on a substrate and a plurality of light-focusing parts disposed corresponding to each of the plurality of the light-focusing parts on the substrate surface so that the incident light is focused on the light-receiving parts, the first and the second scales are defined depending on drift of the light-focusing part based on the corresponding light-receiving part and change in the size of the light-focusing part in the direction along the substrate surface, which are required when the position of each of the light-focusing parts is getting closer to the peripheral camera region from the middle of the camera region along the substrate surface.

* * * * *